(12) United States Patent
Wang

(10) Patent No.: US 10,578,817 B2
(45) Date of Patent: Mar. 3, 2020

(54) SUBSTRATE PACKAGING STRUCTURE INCLUDING CONDUCTIVE BLOCKS AND CONDUCTIVE AREAS FORMED ON SUBSTRATES AND OPTICAL MODULE INCLUDING SAME

(71) Applicant: InnoLight Technology (Suzhou) LTD., Suzhou, Jiangsu (CN)

(72) Inventor: Zhenzhong Wang, Jiangsu (CN)

(73) Assignee: InnoLight Technology (Suzhou) Ltd., Suzhou (CN)

( * ) Notice: Subject to any disclaimer, the term of this patent is extended or adjusted under 35 U.S.C. 154(b) by 0 days.

(21) Appl. No.: 15/862,145

(22) Filed: Jan. 4, 2018

(65) Prior Publication Data

US 2018/0284374 A1    Oct. 4, 2018

(30) Foreign Application Priority Data

Mar. 29, 2017   (CN) .......................... 2017 1 0198988

(51) Int. Cl.
| | |
|---|---|
| *G02B 6/42* | (2006.01) |
| *H01S 5/022* | (2006.01) |
| *H04B 10/50* | (2013.01) |
| *H01S 5/12* | (2006.01) |
| *H01S 5/062* | (2006.01) |

(52) U.S. Cl.
CPC .......... *G02B 6/4281* (2013.01); *G02B 6/428* (2013.01); *G02B 6/4245* (2013.01); *G02B 6/4256* (2013.01); *G02B 6/4269* (2013.01); *G02B 6/4279* (2013.01); *H01S 5/02276* (2013.01); *H01S 5/12* (2013.01); *H04B 10/505* (2013.01); *H01S 5/02248* (2013.01); *H01S 5/06226* (2013.01)

(58) Field of Classification Search
CPC .... H01S 5/02276; H01S 5/12; H01S 5/06226; H01S 5/02248; G02B 6/428; G02B 6/4279; G02B 6/4245; G02B 6/4281; H05K 2201/04–058; H05K 2201/10–10992; H05K 2201/07–0792; H05K 2201/09327; H05K 2201/09445; H05K 2201/09754; H05K 2201/045; H05K 2201/09954; H05K 2201/03–0397; H05K 1/0274; H05K 1/11; G01R 31/046; H01L 23/49586
See application file for complete search history.

(56) References Cited

U.S. PATENT DOCUMENTS

| | | | |
|---|---|---|---|
| 2003/0081297 A1 | 5/2003 | Hasegawa et al. | |
| 2005/0184381 A1* | 8/2005 | Asahi ................. | H01R 13/2414 257/693 |

* cited by examiner

*Primary Examiner* — Nelson Garces
(74) *Attorney, Agent, or Firm* — Finnegan, Henderson, Farabow, Garrett & Dunner, LLP

(57) ABSTRACT

A substrate packaging structure includes: a first substrate and a second substrate that are electrically connected; a plurality of conductive blocks arranged on each one of the first substrate and the second substrate, and electrically connected to each other; first and second conductive areas respectively formed on upper and side surfaces of the first substrate; a first reference conductive area formed below the upper surface of the first substrate and electrically connected to the first and second conductive areas; third and fourth conductive areas respectively formed on upper and side surfaces of the second substrate; and a second reference conductive area formed below the upper surface of the second substrate and electrically connected to the third and fourth conductive areas. The first conductive area on the first substrate is electrically connected to the third conductive area on the second substrate.

10 Claims, 5 Drawing Sheets

SUBSTRATE PACKAGING STRUCTURE INCLUDING CONDUCTIVE BLOCKS AND CONDUCTIVE AREAS FORMED ON SUBSTRATES AND OPTICAL MODULE INCLUDING SAME

CROSS-REFERENCE TO RELATED APPLICATION

This application is based upon and claims priority to Chinese Patent Application 201710198988.0, filed on Mar. 29, 2017, the entire content of which is incorporated herein by reference.

FIELD OF THE DISCLOSURE

The present application relates to optical communication technology and, more particularly, relates to an ultra-high-speed substrate packaging structure and an optical module including the ultra-high-speed substrate packaging structure.

BACKGROUND

Currently, the transmission speed of high-speed optical communication links ranges from a traditional range of 1.25 Gbps-10 Gbps to up to 25 Gbps for single-channel links. An increase in the transmission rate requires increased bandwidth of transmission links. A bandwidth of 7 GHz is required to transmit 10 Gbps signals, and a bandwidth of 21 GHz is required to transmit 25 Gbps signals. A plurality of carriers exist in high-speed links of optical modules. The carriers normally include:

a printed circuit board (PCB), which is a carrier used for surface-mount device (SMD) components, which can be linked with a system, and is low cost;

a flexible printed circuit (FPC), which is similar to a PCB and has advantages of being able to interconnect two hard carriers and absorb space tolerance;

an airtight ceramic box, which is used in device packaging that has requirements for high airtightness, such as lasers, thermoelectric coolers (TEC), photo detectors (PD), etc.; and a ceramic substrate, which is used for optoelectronic devices and has good heat dissipation properties and high processing precision.

In general, a PCB and an FPC, and an FPC and a box may be soldered using a tin-soldering process; and an optoelectronic device and a ceramic substrate may be soldered using a gold-tin soldering process. In order to establish connections between the ceramic substrate and transmission lines (PCB, FPC, or Ceramic Box) over an entire link, two types of carriers normally undergo a gold wire bonding process. The relatively simple operation, easy automation control, and high reliability make a gold wire bonding process a convenient option in the packaging process. The equivalent model for gold wiring is electrical induction; direct induction at high frequencies is associated with severe bandwidth attenuation. Consequently, the bandwidth of the entire link is directly affected by the interconnect bandwidth between the ceramic substrate and the transmission lines.

In terms of single-mode transmissions on the market, distributed feedback (DFB) lasers are available at low cost and are widely employed in long-distance transmissions. While DFB lasers usually employ current modulation, they have a relatively small inherent internal resistance that is usually 10 ohms. However, the impedance of transmission line is usually designed as differential 50 ohm, which can produce a reflection that affects signal quality. Moreover, the drive current of a DFB laser is relatively large, and, as temperature increases, the corresponding drive current must be increased to meet transmission requirements. Since lasers have a relatively high power consumption density, a good method for heat dissipation is necessary for lasers to meet optimum working conditions.

As shown in FIG. 1, a substrate packaging structure of an optical module includes a first substrate 10' and a second substrate 20' that are electrically connected. Electrodes 11' are arranged on the first substrate 10' and electrically connected to the first substrate 10'. Transmission lines 21' and a metal layer 22' for transmitting signals are arranged on the second substrate 20'. The first substrate 10' and the transmission lines 21' on the second substrate 20' are electrically connected through connection lines 31' in order to transmit laser signals.

In the packaging structure of FIG. 1, the first substrate 10' is made of aluminum nitride ceramic, is gold plated, and has a high thermal conductivity coefficient. The electrodes 11' are soldered onto the first substrate 10' by a gold-tin soldering process. Then the entire assembly is soldered onto a heat sink, and finally connected to an outer case of the module for heat dissipation. In terms of the electrical performance of a laser, generally the cathode of a laser is soldered onto the traces of the gold-plated first substrate 10' through a gold-tin soldering process, and the anode of the laser is soldered onto another gold-plated surface of the first substrate 10' through a gold wire bonding process. Then the first substrate 10' is electrically connected to the second substrate 20' (PCB or FPC) through gold wires. The result from a time domain reflectometry (TDR) simulation is shown in the graph of FIG. 2. In the graph of FIG. 2, the curve represents impedance versus time, and the time is related to a position. The peak of the curve shows that the impedance of the packaging structure is 59.5 ohm.

SUMMARY

According to an aspect of the present disclosure, a substrate packaging structure includes: a first substrate and a second substrate that are electrically connected; a plurality of conductive blocks are arranged on each one of the first substrate and the second substrate; the conductive blocks on the first substrate being electrically connected to the conductive blocks on the second substrate. A first conductive area and a second conductive area are formed on an upper surface and a side surface of the first substrate, respectively. A first reference conductive area is formed below the upper surface of the first substrate. A third conductive area and a fourth conductive area are formed on an upper surface and a side surface of the second substrate, respectively. A second reference conductive area is formed below the upper surface of the second substrate. The first conductive area, the second conductive area, and the first reference conductive area on the first substrate are electrically connected to one another. The third conductive area, the fourth conductive area, and the second reference conductive area on the second substrate are electrically connected to one another. The first conductive area on the first substrate is electrically connected to the third conductive area on the second substrate.

According to another aspect of the present disclosure, an optical module includes the aforementioned substrate packaging structure.

Compared to currently available technology, the technical solution provided by the present application can provide a low-inductance return path, improve the impedance properties of the packaging structure, increase packaging bandwidth, and enable ultra-high-speed interconnection at low cost.

DETAILED DESCRIPTION

Figure 1:
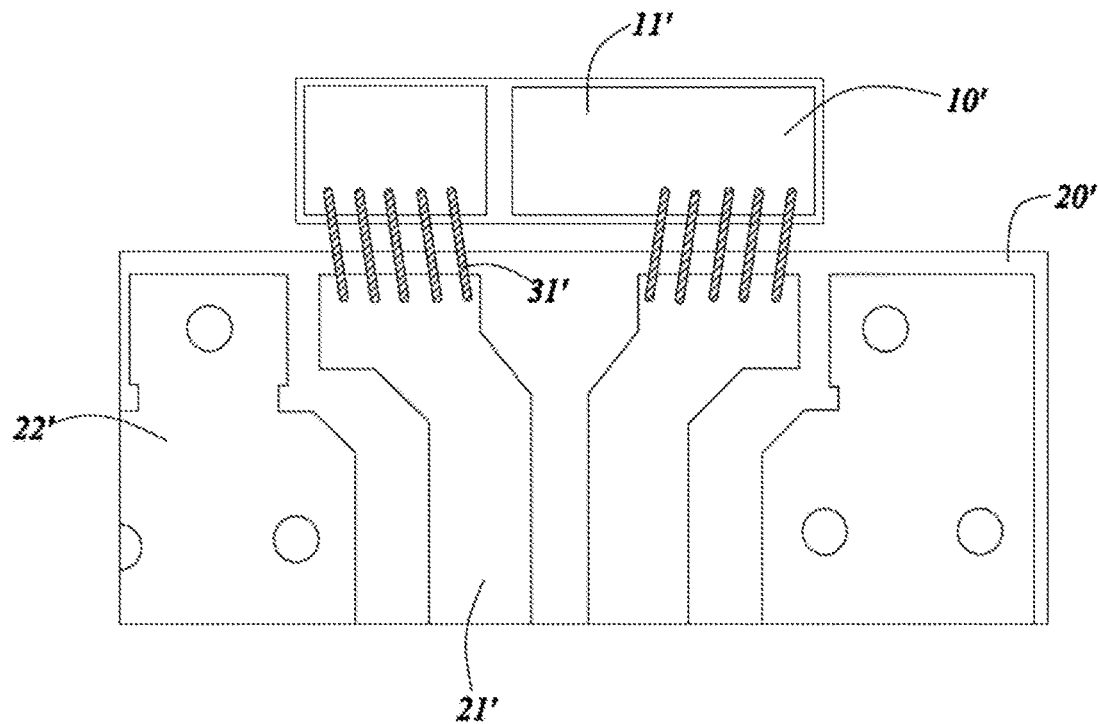
FIG. 1 is a top-view structural diagram showing a substrate packaging structure.
Figure 2:
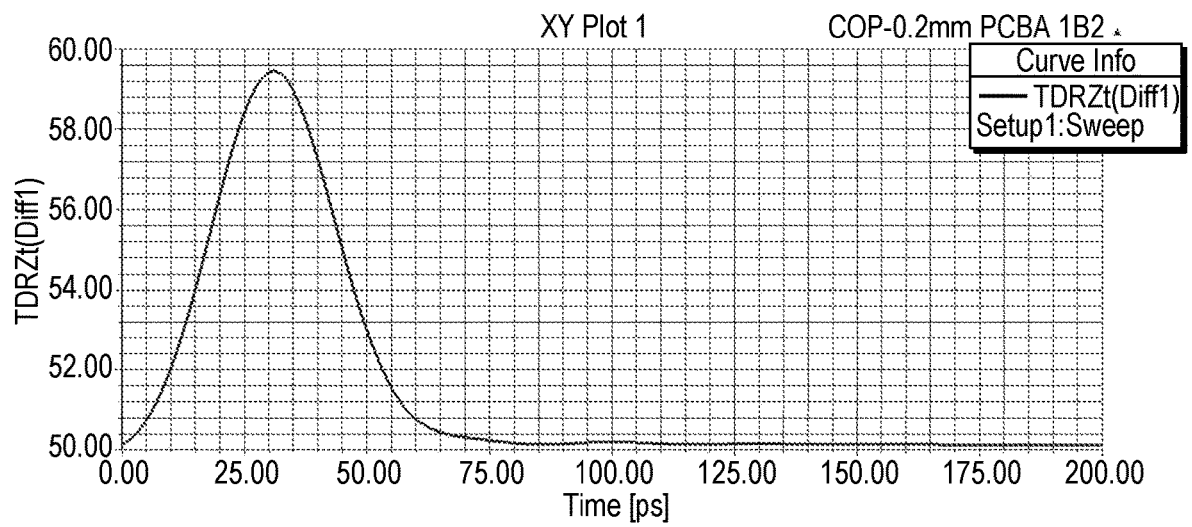
FIG. 2 is a graph showing results of a time domain reflectometry (TDR) simulation for the substrate packaging structure in FIG. 1.

Reference will now be made in detail to the present embodiments, examples of which are illustrated in the accompanying drawings. Wherever possible, the same reference numbers will be used throughout the drawings to refer to the same or like parts.

The text below provides a detailed description of the present application through referencing specific embodiments as shown in the attached drawings. However, these embodiments do not limit the application; the scope of protection for the present application covers changes made to the structure, method, or function by persons of ordinary skill in the art based on the embodiments.

In order to facilitate the presentation of the drawings in the present application, the sizes of certain structures or parts have been enlarged relative to other structures or parts; as such, they are only for the purpose of illustrating the basic structure of the subject matter of the present application.

Terms in the text indicating relative spatial position, such as "upper," "above," "lower," "below," and so forth, are used for explanatory purposes in describing the relationship between a unit or feature depicted in a drawing with another unit or feature therein. Terms indicating relative spatial position can refer to positions other than those depicted in the drawings when a device is being used or operated. For example, if the device shown in a drawing is flipped over, a unit which is described as being located "below" or "under" another unit or feature will be located "above" the other unit or feature. Therefore, the exemplary term "below" can include positions both above and below. A device can be oriented in other ways (rotated 90 degrees or facing another direction); as such, descriptive spatially-related terms that appear in the text should be interpreted accordingly.

When an element or layer is said to be "above" another part or layer or "connected to" another part or layer, it may be directly above the other part or layer or directly connected to the other part or layer, or there may be an intermediate element(s) or layer(s). Conversely, when a part is said to be "directly above another part or layer" or "directly connected to another part or layer," there cannot be any intermediate parts or layers.

Figure 3:
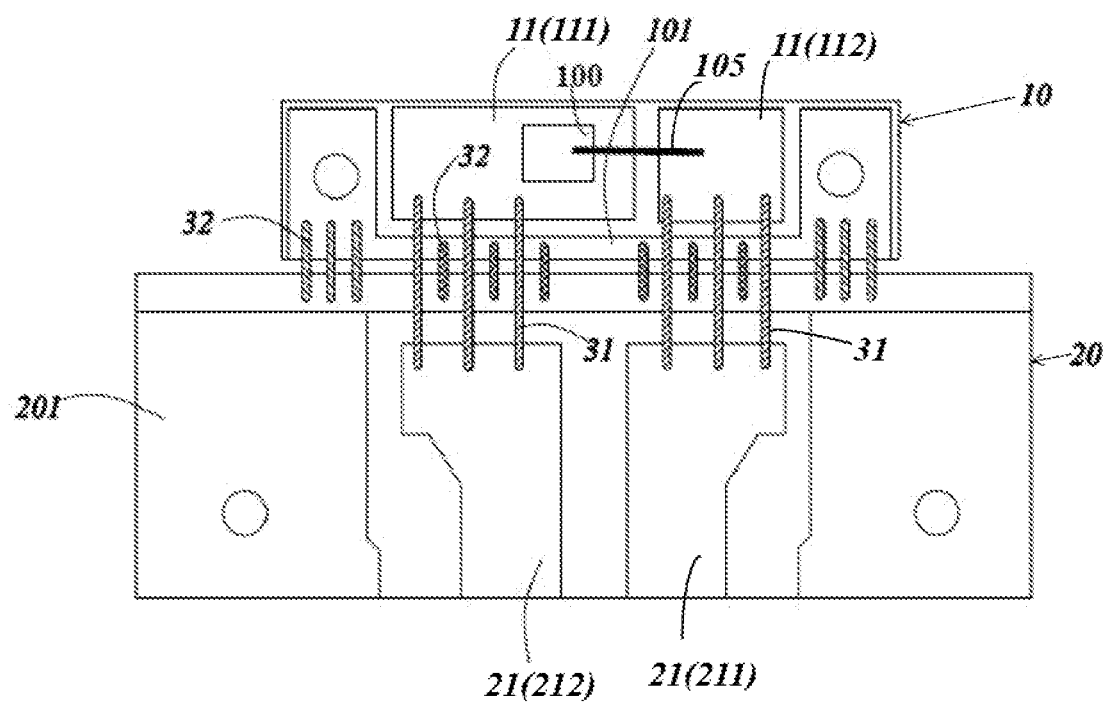
FIG. 3 is a top-view structural diagram showing an ultra-high-speed substrate packaging structure according to a first embodiment of the present disclosure.
Figure 4:
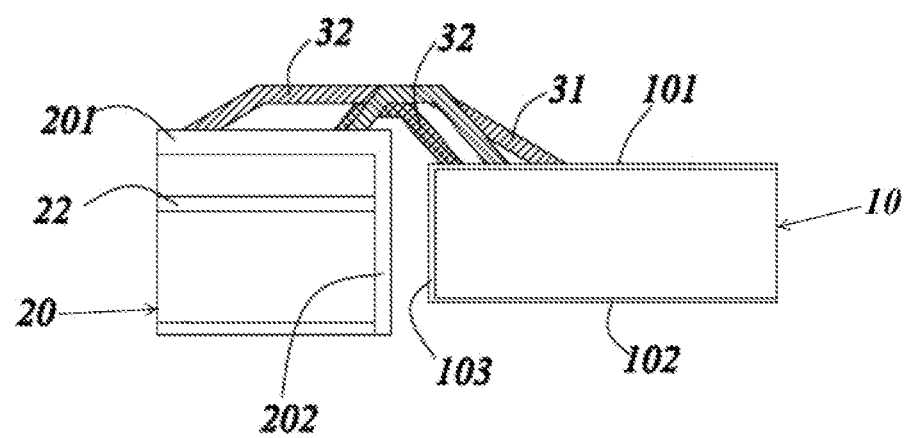
FIG. 4 is a side-view structural diagram showing the ultra-high-speed substrate packaging structure according to the first embodiment of the present disclosure.

FIGS. 3 and 4 illustrate an ultra-high-speed substrate packaging structure according to a first embodiment of the present disclosure. "Ultra-high-speed" in the present application refers to a transmission speed greater than a 1 Gbps transmission rate. The ultra-high-speed substrate packaging structure in the embodiment includes a first substrate 10 and a second substrate 20 that are electrically connected. A plurality of conductive blocks are arranged on each one of the first substrate 10 and the second substrate 20. The plurality of conductive blocks arranged on the first substrate 10 include electrode conductive blocks 11, and the plurality of conductive blocks arranged on the second substrate 20 include transmission line conductive blocks 21. The electrode conductive blocks 11 are electrically connected to the transmission line conductive blocks 21 by signal lines 31 for the transmission of electrical signals. In an optical module that includes the ultra-high-speed substrate packaging structure, a laser 100 is arranged on the first substrate 10. The laser can be a distributed feedback (DFB) laser or an externally modulated laser (EML).

Figure 5:
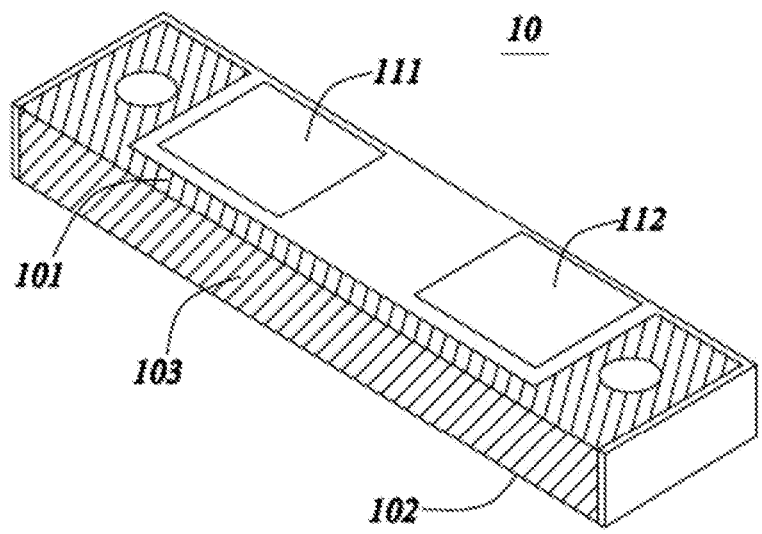
FIG. 5 is a perspective view structural diagram showing a first substrate according to the first embodiment of the present disclosure.

FIG. 5 illustrates an example of the first substrate 10 provided as a ceramic substrate, consistent with the present embodiment. In some alternative embodiments, the first substrate 10 may be a printed circuit board (PCB) or a flexible printed circuit (FPC). Each of the electrode conductive blocks 11 formed on the first substrate 10 includes a first electrode 111 and a second electrode 112, which may be used as a negative electrode and a positive electrode for a high-speed signal, respectively.

A plurality of conductive areas may be formed on the surface of the first substrate 10 by electroplating, depositing, or other methods, to provide a reference return circuit for signals. Specifically, a first conductive area 101 is formed by electroplating part of an area outside the electrodes on the upper surface of the first substrate 10, the first conductive area 101 serving as a top reference return circuit for the first substrate 10. A fifth conductive area 102 is formed by electroplating the lower surface of the first substrate 10, the fifth conductive area 102 serving as a bottom reference return circuit for the substrate 10. Thus, the fifth conductive area 102 constitutes a first reference conductive area. A second conductive area 103 is formed by electroplating an entire side surface of the first substrate 10. The first conductive area 101 and the fifth conductive area 102 are connected by the second conductive area 103, which serves as a side reference return circuit for the first substrate 10. In some alternative embodiments, the fifth conductive area 102 may be formed as a middle layer of the first substrate 10, instead of being formed on the lower surface of the first substrate 10.

Figure 6:
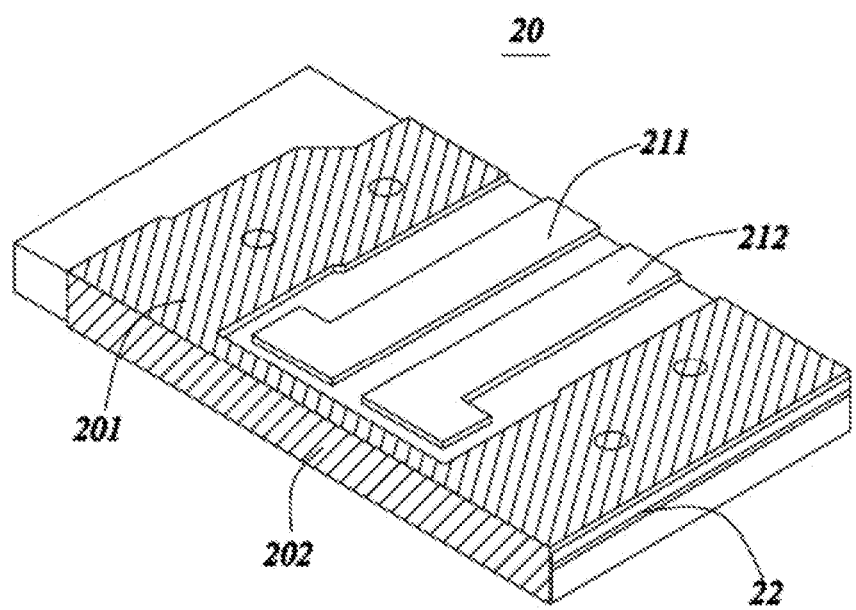
FIG. 6 is a perspective view structural diagram showing a second substrate according to the first embodiment of the present disclosure.

As shown in FIG. 6, the second substrate 20 in the present embodiment is a printed circuit board (PCB), a flexible printed circuit (FPC), or a multilayer ceramic substrate. The transmission line conductive blocks 21 formed on the second substrate 20 include a first transmission line 211 and a second transmission line 212, which are electrically connected to the first electrode 111 and the second electrode 112 on the first substrate 10, respectively, in order to transmit high-speed signals. Moreover, a transmission line reference layer 22 is arranged in the middle of the second substrate 20 as a middle layer in the second substrate 20 to provide a transmission line reference return circuit for the transmission lines.

A plurality of conductive areas are formed by electroplating an entire outside area of the second substrate 20 to provide a reference return circuit for signals. Specifically, a third conductive area 201 is formed by electroplating an area outside the transmission lines on the upper surface of the second substrate 20, the third conductive area 201 serving as the top reference return circuit for the second substrate 20. A fourth conductive area 202 is formed by electroplating an entire side surface of the second substrate 20, the fourth conductive area 202 serving as the side reference return circuit for the second substrate 20.

Figure 9:
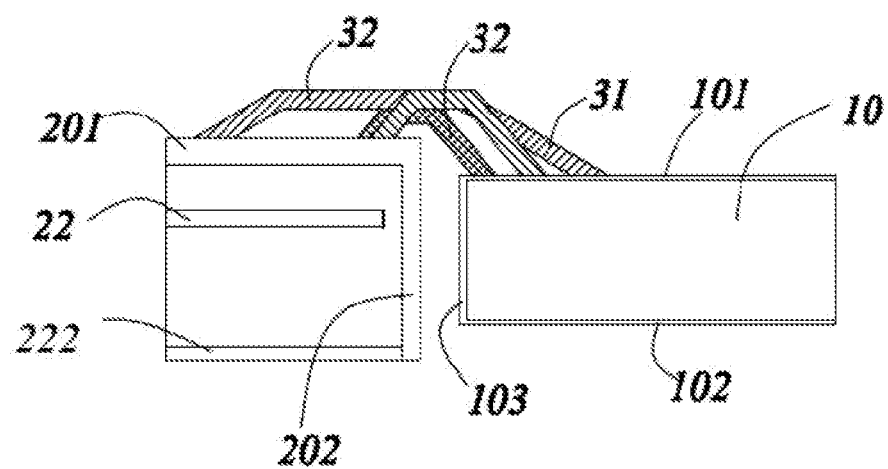
FIG. 9 is a side-view structural diagram showing the ultra-high-speed substrate packaging structure according to another embodiment of the present disclosure.

The transmission line reference layer 22 constitutes a second reference conductive area. In some alternative embodiments, as shown in FIG. 9, a conductive layer 222 can be formed on a bottom surface of the second substrate 20, to constitute the second reference conductive area.

As shown in FIGS. 3 and 4, in the present embodiment, the electrode conductive blocks 11 on the first substrate 10 are electrically connected to the transmission line conductive blocks 21 on the second substrate 20 through the signal lines 31. In addition, the first conductive area 101 on the first substrate 10 is electrically connected to the third conductive area 201 on the second substrate 20 through a plurality of reference return circuit lines 32, providing a reference return circuit for the signal lines through the reference return circuit lines 32.

The signal lines 31 and the reference return circuit lines 32 in the present embodiment are gold wires formed through a gold wire bonding process. The signal lines 31 and some of the reference return circuit lines 32 are configured in a staggered manner; the rest of the reference return circuit lines 32 are located on the two sides of the signal lines 31.

It should be understood that the wire bonding of the signal lines 31 and the reference return circuit lines 32 may also be configured in another manner such as a stacked manner. Moreover, the first conductive area 101 on the first substrate 10 may be electrically connected to the third conductive area 201 on the second substrate 20 by filling the area between them with conduction material (for example, tin solder). Of course, there are other appropriate methods for establishing an electrical connection but detailed explanations of other examples will not be given here.

Further, in the present embodiment, a direct electrical connection is established between the first conductive area 101 on the first substrate 10 and the third conductive area 201 on the second substrate 20 through a plurality of reference return circuit lines 32. In other embodiments, an indirect electrical connection can be established between the first conductive area 101 and the third conductive area 201 by electrically connecting the second conductive area 103 or the fifth conductive area 102 on the first substrate 10 and the fourth conductive area 202 on the second substrate 20; detailed explanations of the examples will not be given here.

Referring to FIG. 3, the laser 100 is arranged on the first electrode 111 on the first substrate 10. A bottom surface electrode of the laser 100 is electrically connected to the first electrode 111 through, for example, weld bonding. Because the first electrode 111 is electrically connected to the second transmission line 212 through the signal lines 31, the bottom surface electrode of the laser 100 is electrically connected to the second transmission line 212. A top surface electrode of the laser 100 is electrically connected to the second electrode 112 via a conductive line 105. Because the second electrode 112 is electrically connected to the first transmission line 211 through the signal lines 31, the top surface electrode of the laser 100 is electrically connected to the first transmission line 211.

In transmission line theory, the return signal of a high-speed signal line is below the high-speed line, and as the frequency increases, the energy density below the transmission line also increases. Thus, the energy density of the return path of the high-speed signal below the high-speed wire-bonding pad is high.

Consequently, in the present embodiment, a plurality of conductive areas are formed by separately electroplating the sidewalls of the first substrate and the second substrate; a bottom reference return circuit on the bottom surface of the first substrate is transferred to the top reference return circuit; and the transmission line reference return circuit on the second substrate is transferred to the top reference return circuit. A connection is formed through the bonding of gold wires to provide a low-inductance return path, and a three-dimensional reference is provided for each signal line through a reference return circuit. Thus, the impedance properties of the packaging structure are improved and the packaging bandwidth is increased.

It should be understood that in the present embodiment a three-dimensional reference is provided for the signal lines by forming reference return circuit lines on the first substrate and the second substrate, and by electrically connecting the conductive areas on the first substrate 10 and the second substrate 20 through cross bonding. In other embodiments, soldering, electrically conductive adhesive, and other methods may be employed to electrically connect the fifth conductive area 102 and the fourth conductive area 202. These other methods may also provide a three-dimensional reference for the signal lines for the purpose of improving impedance properties and increasing packaging bandwidth.

Figure 7:
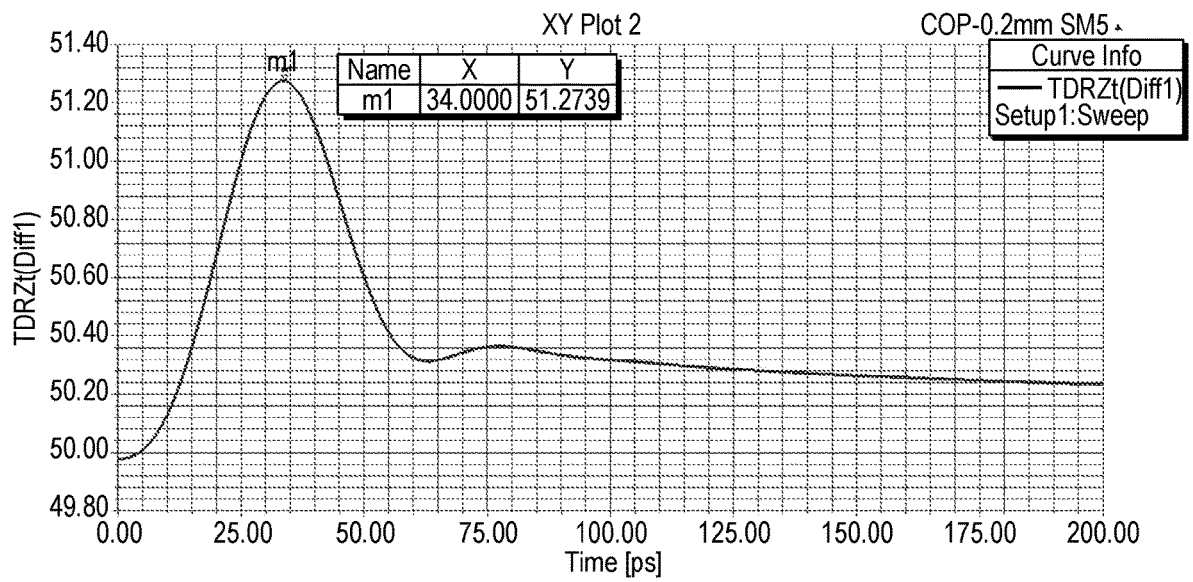
FIG. 7 is a graph showing results of a TDR simulation for the ultra-high-speed substrate packaging structure according to the first embodiment of the present disclosure.

The results of a time domain reflectometry (TDR) simulation in FIG. 7 show that the impedance of the packaging structure is approximately 51 ohm and the packaging bandwidth exceeds 50 GHz in the present embodiment.

In the present embodiment, there are two electrodes and two transmission lines used for transmitting signals; in other embodiments, the quantity and the position of electrodes and transmission lines may be configured differently to accommodate requirements; all embodiments that improve the impedance of the packaging structure by electroplating the sidewalls fall within the scope of protection of the present application.

Although the present embodiment is explained using a ceramic substrate as an example for the first substrate and a PCB, a FPC, or a multilayer ceramic substrate as an example for the second substrate, other embodiments of the present application may use any two types of high-speed substrate as the first substrate and the second substrate, but further details will not be provided here.

Figure 8:
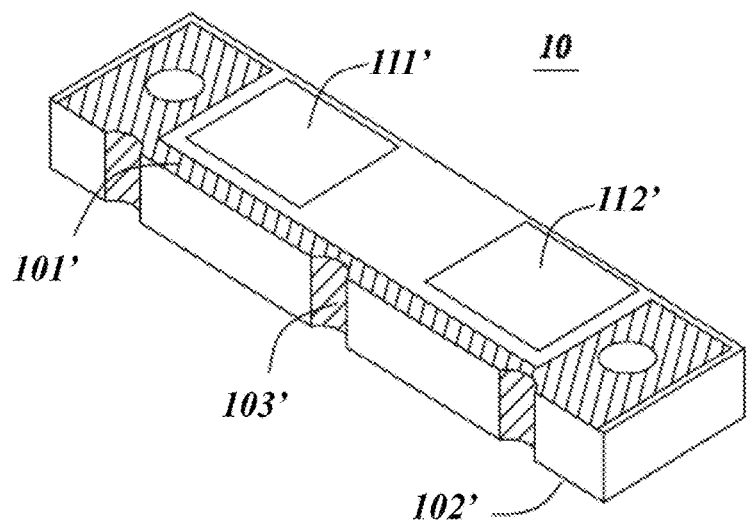
FIG. 8 is a perspective view structural diagram showing a first substrate according to a second embodiment of the present disclosure.

As shown in FIGS. 3 and 8, an ultra-high-speed substrate packaging structure in a second embodiment of the present disclosure is introduced. The ultra-high-speed substrate packaging structure in this embodiment includes the first substrate 10 and the second substrate 20 that are electrically connected. The plurality of electrode conductive blocks 11 are arranged on the first substrate 10. The plurality of transmission line conductive blocks 21 are arranged on the second substrate 20. The electrode conductive blocks 11 are electrically connected to the transmission line conductive blocks 21 through signal lines 31 for electrical signal transmission. At the same time, the plurality of reference return circuit lines 32 are also arranged between the first substrate 10 and the second substrate 20 to provide a three-dimensional reference for the signal lines. The configuration of the electrode conductive blocks 11, the transmission lines 21, the signal line conductive blocks 31, and the reference return circuit lines 32 is the same as in the first embodiment and therefore will not be repeated here.

As shown in FIG. 8, an illustration of the second embodiment is made by an example in which the first substrate 10 is again a ceramic substrate. The electrode conductive blocks 11 include a first electrode 111' and a second electrode 112' formed on the first substrate 10, which are used as the negative electrode and the positive electrode for high-speed signals, respectively.

A plurality of conductive areas are formed by electroplating the outside of the first substrate 10 to provide a reference return circuit for signals. Specifically, a first conductive area 101' is formed by electroplating the area outside the electrodes on the upper surface of the first substrate 10, the first conductive area 101' serving as a top reference return circuit for the first substrate 10. A fifth conductive area 102' is formed by electroplating the lower surface of the first substrate 10, the fifth conductive area 102' serving as the bottom reference return circuit for the substrate 10. A second conductive area 103' is formed by electroplating part of a side surface of the first substrate 10. The first conductive area 101' and the fifth conductive area 102' are connected by the second conductive area 103', which serves as a side reference return circuit for the first substrate 10. The bottom reference return circuit for the first substrate 10 may be transferred to the top reference return circuit through the configuration of the first, second, and fifth conductive areas 101', 102', and 103'.

In the second embodiment, the second conductive area 103' is formed by electroplating part of a side surface of the first substrate 10; similarly, the second conductive area 103' can connect the first conductive area 101' and the fifth conductive area 102', transferring the bottom reference return circuit for the first substrate 10 to the top reference return circuit.

It should be understood that in other embodiments of the present application a fourth conductive area 202 may also be formed by electroplating part of a side surface of the second substrate 20, and similarly the transmission line reference return circuit for the second substrate may be transferred to the top reference return circuit. No explanation of the specific structure for the electroplated part of the side surface of the second substrate will be detailed here.

In each of the aforementioned embodiments of an ultra-high-speed substrate packaging structure, an ultra-high-speed substrate packaging structure based on a distributed feedback (DFB) laser is used as an example for illustration purposes. In other embodiments of the present application, the laser may also be an externally modulated laser (EML) or another high-speed laser. Explanations of the examples will not be detailed here.

Compared to currently available technology, the aforementioned technical solution provided by the present disclosure provides the following benefits:

it can provide a low-inductance return path, improve the impedance properties of the packaging structure, increase packaging bandwidth, and enable ultra-high-speed interconnection at low cost.

It should be understood that despite the descriptions of embodiments in the specification, each embodiment does not entail only one single independent technical solution. The specification is written this way simply for the sake of clarity. Those skilled in the art should treat the specification as a whole; the technical solutions associated with the embodiments may be combined in appropriate ways to form other embodiments that can be understood by those skilled in the art.

The series of detailed descriptions above is only intended to provide specific descriptions of feasible embodiments of the present application. The detailed descriptions are not to be construed as limiting the scope of protection for the present application; all equivalent embodiments or changes that are not detached from the techniques of the present application in essence should fall under the scope of protection of the present application.

What is claimed is:

1. A substrate packaging structure, comprising:
   a first substrate and a second substrate that are electrically connected; and
   a plurality of conductive blocks arranged on each one of the first substrate and the second substrate, the conductive blocks on the first substrate being electrically connected to the conductive blocks on the second substrate,
   wherein a first conductive area and a second conductive area are formed on an upper surface and a side surface of the first substrate, respectively,
   a first reference conductive area is formed below the upper surface of the first substrate,
   a third conductive area and a fourth conductive area are formed on an upper surface and a side surface of the second substrate, respectively,
   a second reference conductive area is formed below the upper surface of the second substrate,
   the first conductive area, the second conductive area, and the first reference conductive area on the first substrate are electrically connected to one another,
   the third conductive area, the fourth conductive area, and the second reference conductive area on the second substrate are electrically connected to one another, and
   the first conductive area on the first substrate is electrically connected to the third conductive area on the second substrate,
   wherein the conductive blocks are physically separated and electrically isolated from the first through fourth conductive areas and the first and second reference conductive areas.

2. The substrate packaging structure according to claim 1, wherein the first reference conductive area is formed on a bottom surface of the first substrate, and the second reference conductive area is formed on a bottom surface of or as a middle layer of the second substrate.

3. The substrate packaging structure according to claim 1, wherein the conductive blocks on the first substrate are electrically connected to the conductive blocks on the second substrate through signal lines,
   the first conductive area on the first substrate is electrically connected to the third conductive area on the second substrate through reference return circuit lines, and
   the reference return circuit lines provide a reference return circuit for the signal lines.

4. The substrate packaging structure according to claim 3, wherein the signal lines and the reference return circuit lines are gold wires formed through a gold wire bonding process.

5. The substrate packaging structure according to claim 3, wherein all or some of the signal lines and the reference return circuit lines are configured in a staggered manner.

6. The substrate packaging structure according to claim 3, wherein all or some of the signal lines and the reference return circuit lines are configured in a stacked manner.

7. The substrate packaging structure according to claim 1, wherein the second conductive area covers all or part of the side surface of the first substrate, and the fourth conductive area covers all or part of the side surface of the second substrate.

8. The substrate packaging structure according to claim 1, wherein the first substrate and the second substrate are each one of the following types: ceramic substrates, printed circuit boards (PCBs), or flexible printed circuits (FPCs).

9. An optical module, wherein the optical module comprises the substrate packaging structure according to claim 8.

10. The optical module according to claim 9, wherein a laser is arranged on the first substrate, and the laser is either a distributed feedback (DFB) laser or an externally modulated laser (EML).

* * * * *